(12) United States Patent
Chen et al.

(10) Patent No.: US 11,705,909 B1
(45) Date of Patent: Jul. 18, 2023

(54) FREQUENCY-LOCKED CIRCUIT FOR VARIABLE FREQUENCY TOPOLOGY AND FREQUENCY-LOCKED METHOD THEREOF

(71) Applicant: P-DUKE TECHNOLOGY CO., LTD., Taichung (TW)

(72) Inventors: Tien-Yu Chen, Taichung (TW); Liang-Jhou Dai, Taichung (TW); Wei-Sheng Wang, Taichung (TW); Hsiao-Hua Chi, Taichung (TW); Lien-Hsing Chen, Taichung (TW)

(73) Assignee: P-DUKE TECHNOLOGY CO., LTD., Taichung (TW)

( * ) Notice: Subject to any disclaimer, the term of this patent is extended or adjusted under 35 U.S.C. 154(b) by 0 days.

(21) Appl. No.: 17/813,926

(22) Filed: Jul. 20, 2022

(30) Foreign Application Priority Data

Jul. 11, 2022 (TW) ................................. 111125947
Jul. 11, 2022 (TW) ................................. 111207413

(51) Int. Cl.
*H03L 7/08* (2006.01)

(52) U.S. Cl.
CPC ...................................... *H03L 7/08* (2013.01)

(58) Field of Classification Search
CPC ........................................................ H03L 7/08
See application file for complete search history.

(56) References Cited

U.S. PATENT DOCUMENTS

| 8,294,446 | B2 * | 10/2012 | Rice ................... H03K 5/08 323/283 |
| 8,890,593 | B1 * | 11/2014 | Kim ................. H03L 7/0816 327/158 |
| 9,148,052 | B2 * | 9/2015 | Ko ..................... H02M 1/44 |
| 10,027,225 | B2 * | 7/2018 | Yu ..................... H02M 3/156 |
| 11,496,137 | B2 * | 11/2022 | Lim ..................... H03L 7/091 |
| 2010/0008117 | A1 * | 1/2010 | Luthi ................ H02J 9/005 363/126 |
| 2010/0127682 | A1 * | 5/2010 | Kenly ................ H02M 3/1588 323/282 |

(Continued)

FOREIGN PATENT DOCUMENTS

| CN | 107925343 A | * | 4/2018 | .......... H02M 1/08 |
| CN | 108141047 B | * | 3/2022 | .......... G05F 1/565 |

(Continued)

*Primary Examiner* — Adam D Houston
(74) *Attorney, Agent, or Firm* — CKC & Partners Co., LLC (57) ABSTRACT

A frequency-locked circuit for a variable frequency topology is configured to trigger a Pulse Width Modulation (PWM) controller to lock a frequency of a driving signal outputted by the PWM controller. The frequency-locked circuit includes an AC wave generating circuit and a comparator. The AC wave generating circuit receives and converts the driving signal to generate an AC wave signal. The comparator is electrically connected to the AC wave generating circuit and receives the AC wave signal. The comparator compares the AC wave signal with a reference signal to generate a comparison output signal. In response to determining that the AC wave signal is greater than the reference signal, the comparison output signal triggers the PWM controller to convert the driving signal from one voltage level to another voltage level so as to lock the frequency. The one voltage level is different from the another voltage level.

11 Claims, 6 Drawing Sheets

(56) References Cited

U.S. PATENT DOCUMENTS

2014/0132308 A1* 5/2014 Katyal .................... H03L 7/235
  327/156
2020/0228012 A1   7/2020 Lynch et al.

FOREIGN PATENT DOCUMENTS

| CN | 218041362 U | * | 12/2022 | | |
| DE | 202022104140 U1 | * | 12/2022 | | |
| WO | WO-2018148218 A1 | * | 8/2018 | ............... | G05F 1/46 |

* cited by examiner

FREQUENCY-LOCKED CIRCUIT FOR VARIABLE FREQUENCY TOPOLOGY AND FREQUENCY-LOCKED METHOD THEREOF

RELATED APPLICATIONS

This application claims priority to Taiwan Application Serial Number 111125947 filed on Jul. 11, 2022, and Taiwan Application Serial Number 111207413 filed on Jul. 11, 2022, the disclosures of which are incorporated herein by reference.

BACKGROUND

Technical Field

The present disclosure relates to a frequency-locked circuit and a frequency-locked method thereof. More particularly, the present disclosure relates to a frequency-locked circuit for a variable frequency topology and a frequency-locked method thereof.

Description of Related Art

When an analog Integrated Circuit (IC) with a non-fixed switching frequency is applied to a flyback converter, and an input voltage is operated at a lower voltage level, an internal controller of the product determines that the switching frequency need to be dropped, and this situation will cause the Equivalent Series Resistance (ESR) of the output capacitor to be increased at a low frequency, thus increasing the output ripple voltage. If the output ripple voltage is increased, the accuracy of the output of the power converter will be seriously affected. Moreover, due to the original setting of a Pulse Width Modulation (PWM) controller, the frequency of a driving signal generated by the PWM controller in a heavy-load mode is lower. In the application of a DC-DC converter, the lower frequency of the driving signal will increase the output ripple voltage. Therefore, a frequency-locked circuit for a variable frequency topology and a frequency-locked method thereof which are capable of locking the frequency of the driving signal and reducing the output ripple voltage are commercially desirable.

SUMMARY

According to one aspect of the present disclosure, a frequency-locked circuit for a variable frequency topology is configured to trigger a Pulse Width Modulation (PWM) controller to lock a frequency of a driving signal outputted by the PWM controller. The frequency-locked circuit for the variable frequency topology includes an AC wave generating circuit and a comparator. The AC wave generating circuit receives and converts the driving signal to generate an AC wave signal. The comparator is electrically connected to the AC wave generating circuit and receives the AC wave signal. The comparator compares the AC wave signal with a reference signal to generate a comparison output signal. In response to determining that the AC wave signal is greater than the reference signal, the comparison output signal triggers the PWM controller to convert the driving signal from one voltage level to another voltage level so as to lock the frequency, and the one voltage level is different from the another voltage level.

According to another aspect of the present disclosure, a frequency-locked method of a frequency-locked circuit for a variable frequency topology is configured to trigger a Pulse Width Modulation (PWM) controller to lock a frequency of a driving signal outputted by the PWM controller. The frequency-locked method of the frequency-locked circuit for the variable frequency topology includes performing an AC wave generating step and a signal comparing step. The AC wave generating step includes configuring an AC wave generating circuit to convert the driving signal to generate an AC wave signal. The signal comparing step includes configuring a comparator to compare the AC wave signal with a reference signal to generate a comparison output signal. In response to determining that the AC wave signal is greater than the reference signal, the comparison output signal triggers the PWM controller to convert the driving signal from one voltage level to another voltage level so as to lock the frequency, and the one voltage level is different from the another voltage level.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
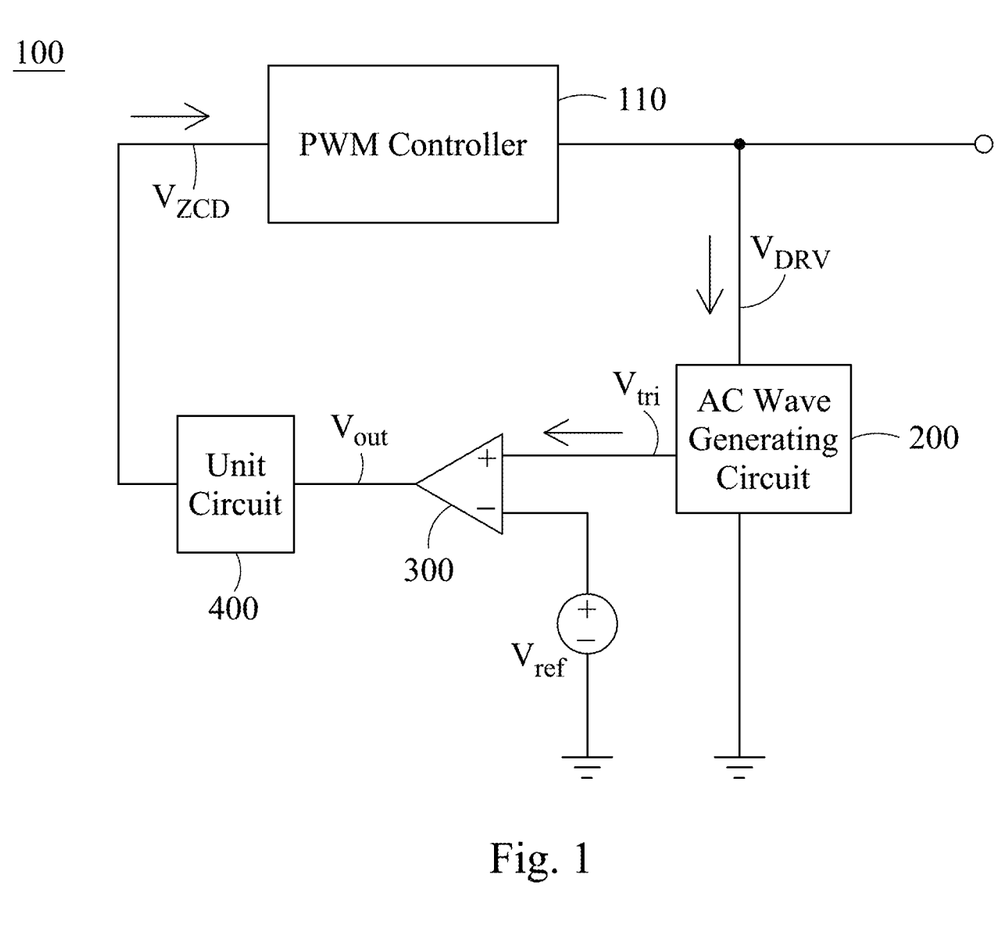
FIG. 1 shows a block diagram of a frequency-locked circuit for a variable frequency topology according to a first embodiment of the present disclosure.

Please refer to FIG. 1. FIG. 1 shows a block diagram of a frequency-locked circuit 100 for a variable frequency topology according to a first embodiment of the present disclosure. The frequency-locked circuit 100 for the variable frequency topology is configured to trigger a Pulse Width Modulation (PWM) controller 110 to lock a frequency of a driving signal $V_{DRV}$ outputted by the PWM controller 110. The frequency-locked circuit 100 for the variable frequency topology includes an AC wave generating circuit 200, a comparator 300 and a unit circuit 400. The AC wave generating circuit 200 receives and converts the driving signal $V_{DRV}$ to generate an AC wave signal $V_{tri}$. The comparator 300 is electrically connected to the AC wave generating circuit 200 and receives the AC wave signal $V_{tri}$. The comparator 300 compares the AC wave signal $V_{tri}$ with a reference signal $V_{ref}$ to generate a comparison output signal $V_{out}$. In response to determining that the AC wave signal $V_{tri}$ is greater than the reference signal $V_{ref}$, the comparison output signal $V_{out}$ triggers the PWM controller 110 to convert the driving signal $V_{DRV}$ from one voltage level to another voltage level so as to lock the frequency. The one voltage level is different from the another voltage level. The unit circuit 400 is electrically connected to the comparator 300 and is configured to convert the comparison output signal $V_{out}$ into a control input signal $V_{ZCD}$ of the PWM controller 110. Therefore, the frequency-locked circuit 100 for the variable frequency topology of the present disclosure detects the driving signal $V_{DRV}$ to form the AC wave signal $V_{tri}$ and compares the AC wave signal $V_{tri}$ with the reference signal $V_{ref}$, and then triggers the PWM controller 110 to set the driving signal $V_{DRV}$ to a high voltage level according to the comparison output signal $V_{out}$, so that the frequency of the driving signal $V_{DRV}$ can be limited to a predetermined value, and avoid the problem of increasing the output ripple voltage due to the lower frequency of the driving signal $V_{DRV}$ in a conventional circuit. The following are detailed examples to illustrate the details of the above circuit.

Figure 2:
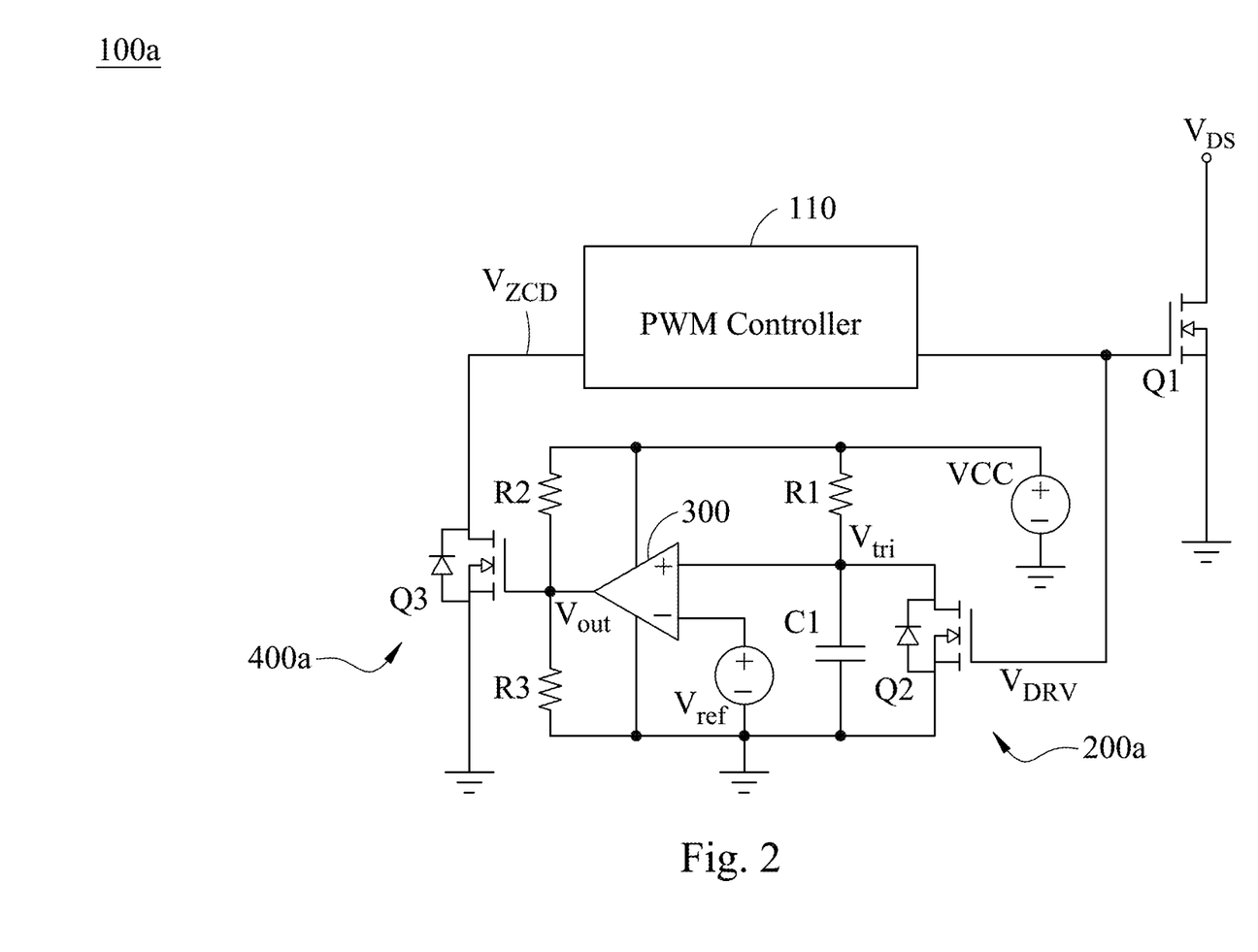
FIG. 2 shows a schematic view of a frequency-locked circuit for a variable frequency topology according to a second embodiment of the present disclosure.

Please refer to FIGS. 1 and 2. FIG. 2 shows a schematic view of a frequency-locked circuit 100a for a variable frequency topology according to a second embodiment of the present disclosure. The frequency-locked circuit 100a for the variable frequency topology is configured to trigger a PWM controller 110 to lock a frequency of a driving signal $V_{DRV}$. A control input signal $V_{ZCD}$ is inputted into the PWM controller 110, and the driving signal $V_{DRV}$ is outputted by the PWM controller 110. The driving signal $V_{DRV}$ of the PWM controller 110 is electrically connected to a converting switch Q1 of a DC-DC converter, so that the converting switch Q1 is controlled by the driving signal $V_{DRV}$ to be turned on or off. The frequency is corresponding to turning on and off of the converting switch Q1, i.e., the frequency is corresponding to a drain-source voltage $V_{DS}$ of the converting switch Q1. The frequency-locked circuit 100a for the variable frequency topology includes an AC wave generating circuit 200a, a comparator 300 and a unit circuit 400a.

The AC wave generating circuit 200a receives and converts the driving signal $V_{DRV}$ to generate an AC wave signal $V_{tri}$. In detail, the AC wave generating circuit 200a has a transmitting terminal and includes a switch Q2, a resistor R1 and a capacitor C1. The switch Q2 is electrically connected to the comparator 300. The resistor R1 is electrically connected between the switch Q2 and a power supply voltage VCC. The capacitor C1 is electrically connected between the resistor R1 and a ground voltage (GND). The resistor R1 and the capacitor C1 form an RC charge-discharge circuit. The transmitting terminal is configured to transmit the AC wave signal $V_{tri}$ to the comparator 300 and is located between the resistor R1 and the capacitor C1. The capacitor C1 is electrically connected to the comparator 300 and the switch Q2. In addition, the switch Q2 is controlled by the driving signal $V_{DRV}$ to be turned on or off. In response to determining that the switch Q2 is turned on (short), the transmitting terminal is discharged to the ground voltage. In response to determining that the switch Q2 is turned off (open), the transmitting terminal is charged to the power supply voltage VCC via the resistor R1 and the capacitor C1 to form the AC wave signal $V_{tri}$. The AC wave signal $V_{tri}$ may have a triangular waveform, and a hypotenuse of the triangular waveform may have an arc shape.

The comparator 300 is electrically connected to the AC wave generating circuit 200a and receives the AC wave signal $V_{tri}$. The comparator 300 compares the AC wave signal $V_{tri}$ with a reference signal $V_{ref}$ to generate a comparison output signal $V_{out}$. In detail, the comparator 300 has a positive input terminal (+), a negative input terminal (−) and a comparison output terminal. The positive input terminal is electrically connected to the transmitting terminal of the AC wave generating circuit 200a to receive the AC wave signal $V_{tri}$. The negative input terminal is electrically connected to the reference signal $V_{ref}$. The comparison output terminal generates the comparison output signal $V_{out}$ according to the AC wave signal $V_{tri}$ and the reference signal $V_{ref}$. The comparison output terminal is electrically connected to two resistors R2, R3. The resistor R2 is connected between the power supply voltage VCC and the comparison output terminal, and the resistor R3 is connected between the comparison output terminal and the ground voltage (GND).

The unit circuit 400a is electrically connected to the comparator 300 and includes a transistor Q3. The transistor Q3 is controlled by the comparison output signal $V_{out}$ to be turned on or off and has a switching state. The transistor Q3 generates the control input signal $V_{ZCD}$ according to the switching state, and transmits the control input signal $V_{ZCD}$ to the PWM controller 110. In response to determining that the transistor Q3 is controlled by the comparison output signal $V_{out}$ to be turned on, the switching state of the transistor Q3 is a turned-on state, and the control input signal $V_{ZCD}$ is a low voltage level. In response to determining that the transistor Q3 is controlled by the comparison output signal $V_{out}$ to be turned off, the switching state of the transistor Q3 is a turned-off state, and the control input signal $V_{ZCD}$ is a high voltage level.

In FIG. 2, in response to determining that the AC wave signal $V_{tri}$ is greater than the reference signal $V_{ref}$, the comparison output signal $V_{out}$ triggers the PWM controller 110 to convert the driving signal $V_{DRV}$ from one voltage level to another voltage level via the unit circuit 400a, thus locking the frequency of the driving signal $V_{DRV}$ (i.e., increasing the frequency). On the contrary, in response to determining that the AC wave signal $V_{tri}$ is smaller than or equal to the reference signal $V_{ref}$, the comparison output signal $V_{out}$ triggers the PWM controller 110 to keep the driving signal $V_{DRV}$ at the one voltage level via the unit circuit 400a. The one voltage level is different from the another voltage level.

In one embodiment, the variable frequency topology can include the PWM controller 110 and the DC-DC converter, and the driving signal $V_{DRV}$ is configured to control the converting switch Q1 of the DC-DC converter. The one voltage level may be the low voltage level, and the another voltage level may be the high voltage level. Each of the converting switch Q1 of the DC-DC converter, the switch Q2 of the AC wave generating circuit 200a and the transistor Q3 of the unit circuit 400a is a Metal Oxide Semiconductor Field Effect Transistor (MOSFET) or a Bipolar Junction Transistor (BJT). The reference signal $V_{ref}$ is a fixed reference voltage.

Therefore, the frequency-locked circuit 100a for the variable frequency topology of the present disclosure detects the driving signal $V_{DRV}$ to form the AC wave signal $V_{tri}$ and compares the AC wave signal $V_{tri}$ with the reference signal $V_{ref}$, and then triggers the PWM controller 110 to set the driving signal $V_{DRV}$ to the high voltage level according to the comparison output signal $V_{out}$, so that the frequency of the driving signal $V_{DRV}$ can be limited to a predetermined value, and avoid the problem of increasing the output ripple voltage due to the lower frequency of the driving signal $V_{DRV}$ in a conventional circuit.

Figure 3:
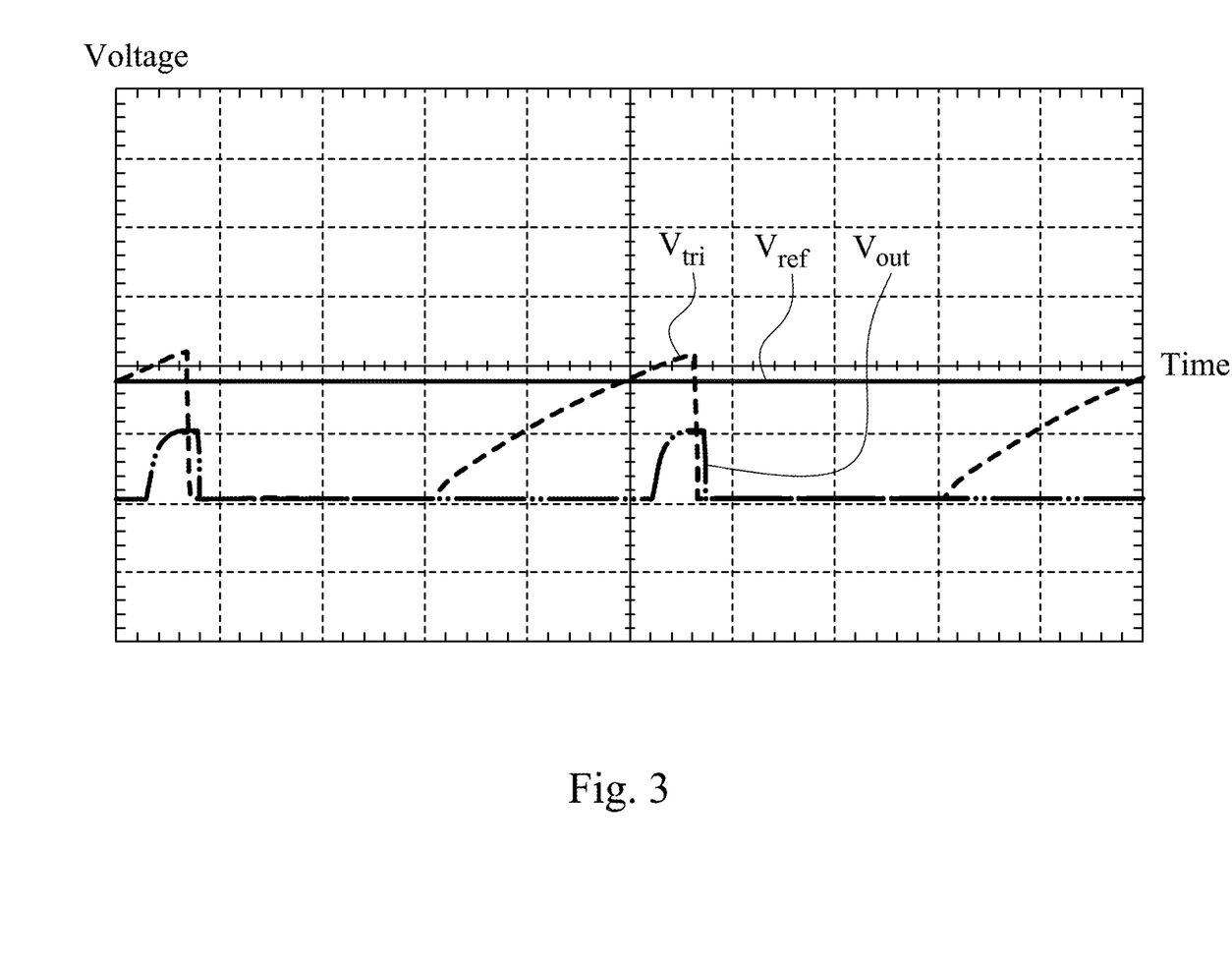
FIG. 3 shows a schematic view of an AC wave signal, a reference signal and a comparison output signal of the frequency-locked circuit for the variable frequency topology of FIG. 2.
Figure 4A:
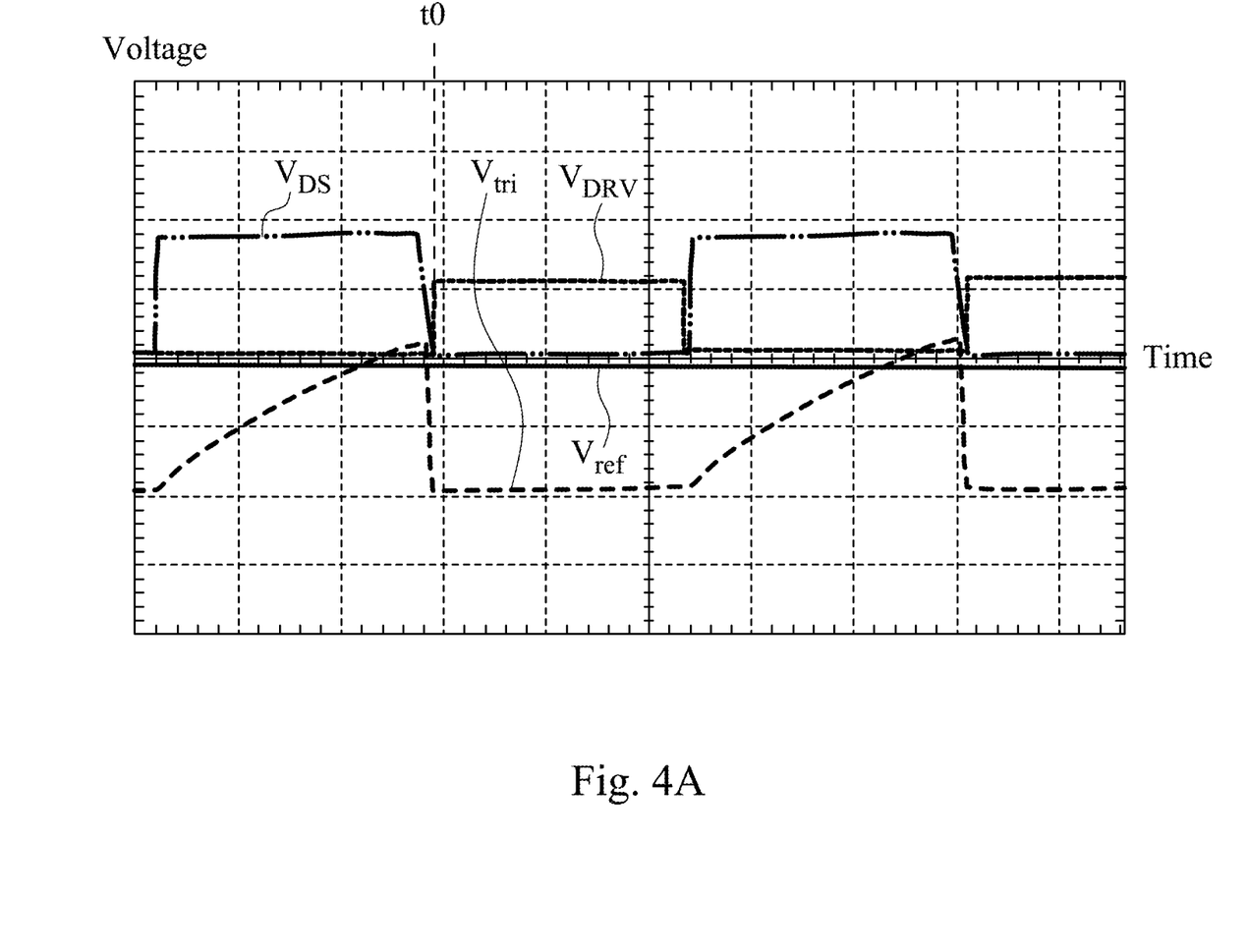
FIG. 4A shows a schematic view of the AC wave signal, the reference signal, a driving signal and a drain-source voltage of the frequency-locked circuit for the variable frequency topology of FIG. 2, when a frequency of the driving signal is not locked.
Figure 4B:
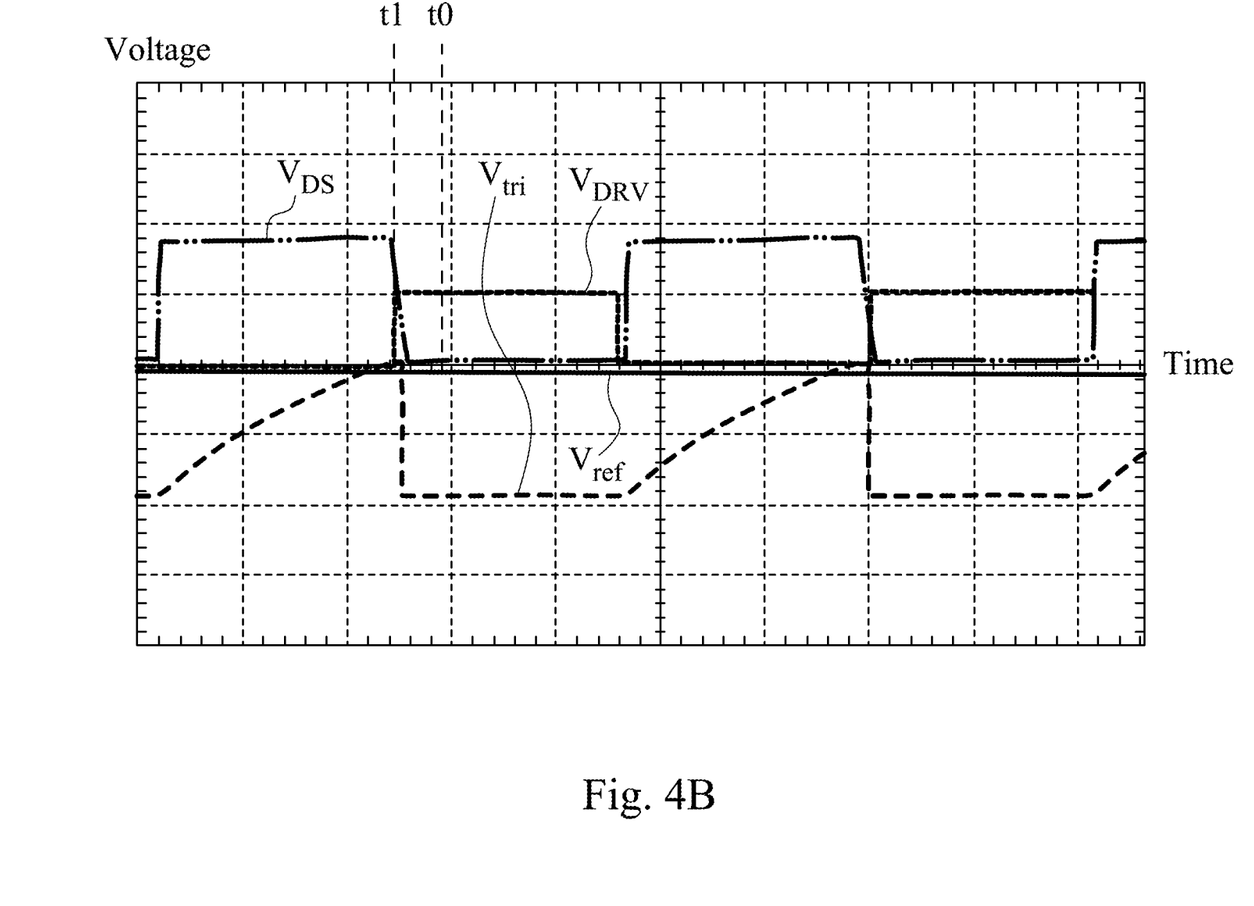
FIG. 4B shows a schematic view of the AC wave signal, the reference signal, the driving signal and the drain-source voltage of the frequency-locked circuit for the variable frequency topology of FIG. 2, when the frequency of the driving signal is locked.

Please refer to FIGS. 2, 3, 4A and 4B. FIG. 3 shows a schematic view of an AC wave signal $V_{tri}$, a reference signal $V_{ref}$ and a comparison output signal $V_{out}$ of the frequency-locked circuit 100a for the variable frequency topology of FIG. 2. FIG. 4A shows a schematic view of the AC wave signal $V_{tri}$, the reference signal $V_{ref}$, a driving signal $V_{DRV}$ and a drain-source voltage $V_{DS}$ of the frequency-locked circuit 100a for the variable frequency topology of FIG. 2, when a frequency of the driving signal $V_{DRV}$ is not locked. FIG. 4B shows a schematic view of the AC wave signal $V_{tri}$, the reference signal $V_{ref}$, the driving signal $V_{DRV}$ and the drain-source voltage $V_{DS}$ of the frequency-locked circuit 100a for the variable frequency topology of FIG. 2, when the frequency of the driving signal $V_{DRV}$ is locked. In response to determining that the frequency of the driving signal $V_{DRV}$ is higher than or equal to the predetermined value, the charging time period of the RC charge-discharge circuit (i.e., the resistor R1 and the capacitor C1) is shorter, so that the voltage level of the AC wave signal $V_{tri}$ is lower. The AC wave signal $V_{tri}$ is input to the comparator 300 and compared with the reference signal $V_{ref}$. Because the voltage level of the AC wave signal $V_{tri}$ is lower, the voltage level of the AC wave signal $V_{tri}$ is lower than the reference signal $V_{ref}$, so that the comparator 300 outputs the comparison output signal $V_{out}$ having the low voltage level (L), and the PWM controller 110 is inactive at this time (i.e., the PWM controller 110 does not adjust the frequency of the driving signal $V_{DRV}$). On the contrary, in response to determining that the frequency of the driving signal $V_{DRV}$ is lower than the predetermined value, the charging time period of the RC charge-discharge circuit is longer, so that the AC wave signal $V_{tri}$ can be charged to a higher voltage level, i.e., the voltage level of the AC wave signal $V_{tri}$ is higher. The AC wave signal $V_{tri}$ is input to the comparator 300 and compared with the reference signal $V_{ref}$. Because the voltage level of the AC wave signal $V_{tri}$ is higher, the voltage level of the AC wave signal $V_{tri}$ is higher than the reference signal $V_{ref}$, so that the comparator 300 outputs the comparison output signal $V_{out}$ having the high voltage level (H), and then triggers the PWM controller 110 to adjust the frequency of the driving signal $V_{DRV}$ (i.e., increase the frequency to enable the frequency to be locked). In other words, in response to determining that the frequency of the driving signal $V_{DRV}$ is lower than the predetermined value, the frequency-locked circuit 100a for the variable frequency topology of the present disclosure can adjust the driving signal $V_{DRV}$ from a first state to a second state (e.g., from "change at time t0" to "change at time t1"). The first state represents that the driving signal $V_{DRV}$ is changed at time t0, as shown in FIG. 4A. The second state represents that the driving signal $V_{DRV}$ is changed at time t1, as shown in FIG. 4B. Accordingly, the frequency of the driving signal $V_{DRV}$ is locked at a higher frequency (i.e., the predetermined value).

Figure 5:
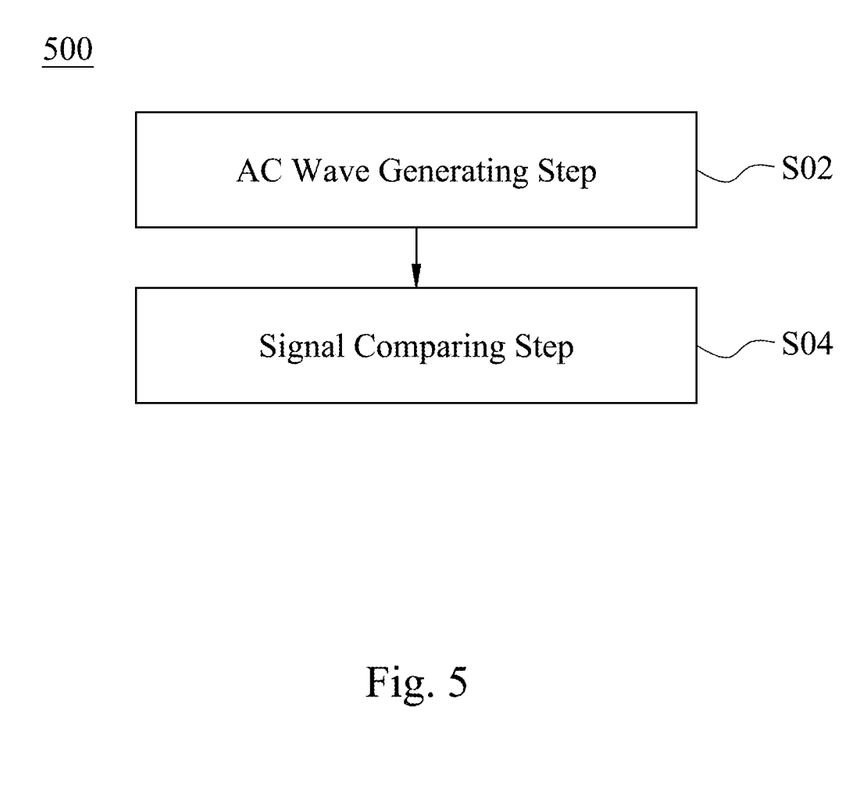
FIG. 5 shows a flow chart of a frequency-locked method of a frequency-locked circuit for a variable frequency topology according to the third embodiment of the present disclosure.

Please refer to FIGS. 1, 2 and 5. FIG. 5 shows a flow chart of a frequency-locked method 500 of a frequency-locked circuit for a variable frequency topology according to the third embodiment of the present disclosure. The frequency-locked method 500 can be applied to each of the frequency-locked circuits 100, 100a for the variable frequency topology of FIGS. 1 and 2. The frequency-locked method 500 of the frequency-locked circuit for the variable frequency topology is configured to trigger a PWM controller 110 to lock a frequency of a driving signal $V_{DRV}$ outputted by the PWM controller 110. The frequency-locked method 500 of the frequency-locked circuit for the variable frequency topology includes performing an AC wave generating step S02 and a signal comparing step S04.

The AC wave generating step S02 includes configuring an AC wave generating circuit (i.e., one of the AC wave generating circuits 200, 200a) to convert the driving signal $V_{DRV}$ to generate an AC wave signal $V_{tri}$. The AC wave signal $V_{tri}$ may have a triangular waveform.

The signal comparing step S04 includes configuring a comparator 300 to compare the AC wave signal $V_{tri}$ with a reference signal $V_{ref}$ to generate a comparison output signal $V_{tri}$. In response to determining that the AC wave signal $V_{tri}$ is greater than the reference signal $V_{ref}$, the comparison output signal $V_{out}$ triggers the PWM controller 110 to convert the driving signal $V_{DRV}$ from one voltage level to another voltage level so as to lock the frequency (i.e., increasing the frequency). The one voltage level is different from the another voltage level. On the contrary, in response to determining that the AC wave signal $V_{tri}$ is smaller than or equal to the reference signal $V_{ref}$, the comparison output signal $V_{out}$ triggers the PWM controller 110 to keep the driving signal $V_{DRV}$ at the one voltage level. The one voltage level is a low voltage level, and the another voltage level is a high voltage level.

In addition, the frequency-locked method 500 of the frequency-locked circuit for the variable frequency topology can further include performing a signal converting step. The signal converting step includes configuring a unit circuit (i.e., one of the unit circuits 400, 400a) to convert the comparison output signal $V_{out}$ into a control input signal $V_{ZCD}$ of the PWM controller 110, thereby triggering the PWM controller 110.

Therefore, the frequency-locked method 500 of the frequency-locked circuit for the variable frequency topology of the present disclosure can generate the control input signal $V_{ZCD}$ by the AC wave generating circuit (i.e., one of the AC wave generating circuits 200, 200a), the comparator 300 and the unit circuit (i.e., one of the unit circuits 400, 400a) to trigger the PWM controller 110 to increase the frequency of the driving signal $V_{DRV}$ when the frequency of the driving signal $V_{DRV}$ is lower than a target frequency (i.e., the predetermined value). In addition, the present disclosure may be applied to a flyback converter (e.g., an active clamp flyback converter or a quasi-resonant flyback converter). In the application of the DC-DC converter, the driving signal $V_{DRV}$ with increased frequency controls the converting switch Q1, so that the DC-DC converter can generate an output with a lower ripple and lower noise to improve the accuracy of the output of the DC-DC converter.

According to the aforementioned embodiments and examples, the advantages of the present disclosure are described as follows.

1. The frequency-locked circuit for the variable frequency topology and the frequency-locked method thereof of the present disclosure can detect the driving signal to form the AC wave signal and compare the AC wave signal with the reference signal, and then trigger the PWM controller to set the driving signal to the high voltage level according to the comparison output signal, so that the frequency of the driving signal can be limited to a predetermined value, and avoid the problem of increasing the output ripple voltage due to the lower frequency of the driving signal in a conventional circuit.

2. The frequency-locked circuit for the variable frequency topology and the frequency-locked method thereof of the present disclosure can generate the control input signal by the AC wave generating circuit, the comparator and the unit circuit to trigger the PWM controller to increase the frequency of the driving signal when the frequency of the driving signal is lower than a target frequency. In addition, in the application of the DC-DC converter, the driving signal with increased frequency controls the converting switch, so that the DC-DC converter can generate an output with a lower ripple and lower noise to improve the accuracy of the output of the DC-DC converter.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A frequency-locked circuit for a variable frequency topology, which is configured to trigger a Pulse Width Modulation (PWM) controller to lock a frequency of a driving signal outputted by the PWM controller, the frequency-locked circuit for the variable frequency topology comprising:
   an AC wave generating circuit receiving and converting the driving signal to generate an AC wave signal; and
   a comparator electrically connected to the AC wave generating circuit and receiving the AC wave signal, wherein the comparator compares the AC wave signal with a reference signal to generate a comparison output signal;
   wherein in response to determining that the AC wave signal is greater than the reference signal, the comparison output signal triggers the PWM controller to convert the driving signal from one voltage level to another voltage level so as to lock the frequency, and the one voltage level is different from the another voltage level.

2. The frequency-locked circuit for the variable frequency topology of claim 1, wherein the AC wave generating circuit has a transmitting terminal and comprises:
   a switch electrically connected to the comparator;
   a resistor electrically connected between the switch and a power supply voltage; and
   a capacitor electrically connected between the resistor and a ground voltage;
   wherein the transmitting terminal is configured to transmit the AC wave signal to the comparator and is located between the resistor and the capacitor.

3. The frequency-locked circuit for the variable frequency topology of claim 2, wherein,
   the switch is controlled by the driving signal to be turned on or off;
   in response to determining that the switch is turned on, the transmitting terminal is discharged to the ground voltage; and
   in response to determining that the switch is turned off, the transmitting terminal is charged to the power supply voltage via the resistor and the capacitor to form the AC wave signal.

4. The frequency-locked circuit for the variable frequency topology of claim 1, wherein the AC wave signal has a triangular waveform, the one voltage level is a low voltage level, and the another voltage level is a high voltage level.

5. The frequency-locked circuit for the variable frequency topology of claim 1, wherein in response to determining that the AC wave signal is smaller than or equal to the reference signal, the comparison output signal triggers the PWM controller to keep the driving signal at the one voltage level.

6. The frequency-locked circuit for the variable frequency topology of claim 2, further comprising:
   a unit circuit electrically connected to the comparator and comprising:
      a transistor controlled by the comparison output signal to be turned on or off and has a switching state, wherein the transistor generates a control input signal according to the switching state, and transmits the control input signal to the PWM controller.

7. The frequency-locked circuit for the variable frequency topology of claim 6, wherein each of the switch of the AC wave generating circuit and the transistor of the unit circuit is a Metal Oxide Semiconductor Field Effect Transistor (MOSFET) or a Bipolar Junction Transistor (BJT).

8. The frequency-locked circuit for the variable frequency topology of claim 6, wherein,
   in response to determining that the transistor is controlled by the comparison output signal to be turned on, the switching state of the transistor is a turned-on state, and the control input signal is a low voltage level; and
   in response to determining that the transistor is controlled by the comparison output signal to be turned off, the switching state of the transistor is a turned-off state, and the control input signal is a high voltage level.

9. The frequency-locked circuit for the variable frequency topology of claim 1, wherein the driving signal of the PWM controller is electrically connected to a converting switch of a DC-DC converter, so that the converting switch is controlled by the driving signal to be turned on or off, and the frequency is corresponding to turning on and off of the converting switch.

10. A frequency-locked method of a frequency-locked circuit for a variable frequency topology, which is configured to trigger a Pulse Width Modulation (PWM) controller to lock a frequency of a driving signal outputted by the PWM controller, the frequency-locked method of the frequency-locked circuit for the variable frequency topology comprising:
   performing an AC wave generating step, wherein the AC wave generating step comprises configuring an AC wave generating circuit to convert the driving signal to generate an AC wave signal; and
   performing a signal comparing step, wherein the signal comparing step comprises configuring a comparator to compare the AC wave signal with a reference signal to generate a comparison output signal;

wherein in response to determining that the AC wave signal is greater than the reference signal, the comparison output signal triggers the PWM controller to convert the driving signal from one voltage level to another voltage level so as to lock the frequency, and the one voltage level is different from the another voltage level.

11. The frequency-locked method of the frequency-locked circuit for the variable frequency topology of claim 10, wherein, the AC wave signal has a triangular waveform, the one voltage level is a low voltage level, and the another voltage level is a high voltage level; and in response to determining that the AC wave signal is smaller than or equal to the reference signal, the comparison output signal triggers the PWM controller to keep the driving signal at the one voltage level.

* * * * *